United States Patent
Masahara et al.

(10) Patent No.: US 7,189,670 B2
(45) Date of Patent: Mar. 13, 2007

(54) DIELECTRIC CERAMIC AND MULTILAYER CERAMIC SUBSTRATE

(75) Inventors: Koh Masahara, Kobe (JP); Hiroshi Nonoue, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 77 days.

(21) Appl. No.: 11/167,431

(22) Filed: Jun. 28, 2005

(65) Prior Publication Data

US 2006/0014621 A1    Jan. 19, 2006

(30) Foreign Application Priority Data

Jun. 30, 2004    (JP)    ............... 2004-192578

(51) Int. Cl.
  C03C 14/00    (2006.01)
  C03C 10/02    (2006.01)
  C03C 10/04    (2006.01)
(52) U.S. Cl. ............... 501/32; 501/5; 501/10; 428/426
(58) Field of Classification Search .......... 501/5, 501/8, 10, 32; 428/426
See application file for complete search history.

(56) References Cited

U.S. PATENT DOCUMENTS

| | | | |
|---|---|---|---|
| 6,120,906 A | 9/2000 | Terashi | |
| 6,660,670 B2 * | 12/2003 | Terashi et al. | 501/5 |
| 6,753,277 B2 * | 6/2004 | Terashi | 501/32 |
| 6,946,415 B2 * | 9/2005 | Chikagawa et al. | 501/32 |

FOREIGN PATENT DOCUMENTS

| | | |
|---|---|---|
| JP | 10-120436 | 5/1998 |
| JP | 11-012029 | 1/1999 |

* cited by examiner

*Primary Examiner*—Karl Group
(74) *Attorney, Agent, or Firm*—McDermott Will & Emery LLP

(57) ABSTRACT

A dielectric ceramic obtained by firing a raw material comprising an alumina powder, a crystallizable glass powder mainly containing $SiO_2$, CaO and MgO, and a noncrystallizable glass powder mainly containing $SiO_2$, $B_2O_3$ and $Na_2O$. After the firing, the dielectric ceramic contains an alumina crystal phase, a diopside crystal phase $(Ca(Mg, Al)(Si, Al)_2O_6)$ and a magnesia-spinel crystal phase $(MgAl_2O_4)$ and has a porosity of not higher than 2.2% when measured by a mercury penetration method.

6 Claims, 7 Drawing Sheets

DIELECTRIC CERAMIC AND MULTILAYER CERAMIC SUBSTRATE

BACKGROUND OF THE INVENTION

1. Field of the Invention

The present invention relates to a dielectric ceramic which can be obtained through low-temperature firing and also to a multilayer ceramic substrate using the dielectric ceramic.

2. Description of Related Art

With the need of miniaturizing recently spread mobile communication equipment, such as portable phones, and portable communication terminals, the size reduction and performance increase of high-frequency circuit parts for use therein have been pursued.

In high-frequency circuit substrates, a conventional module including a printed substrate and a capacitor or inductor mounted on its surface has been increasingly replaced by a smaller size module consisting of multilayers of dielectric ceramic substrates each patterned with a capacitor or inductor circuit.

The multilayer ceramic substrate is generally fabricated by providing multilayers of green sheets, such as glass ceramics, each carrying a predetermined circuit pattern formed by screen printing or the like, and firing them at a temperature of about 800° C.-about 900° C. A popular material used for the circuit pattern is high-conductivity and air-firable silver (Ag).

Where silver is used as a material for circuit pattern, a dielectric ceramic material for use in the multilayer ceramic substrate needs to be fired at a low temperature of about 800° C.-about 900° C., as described above, and generally comprises a low-firable glass ceramic material obtained by mixing a ceramic filler, e.g. alumina, and a glass (See, for example, Japanese Patent Registration No. 3441924 and Japanese Patent Laying-Open No. Hei 10-120436). However, the higher glass loading lowers mechanical strength, which has been a problem. Another problem of chipping damage likely arises when cutting is applied to the ceramic material after firing.

SUMMARY OF THE INVENTION

It is an object of the present invention to provide a dielectric ceramic which can be obtained through firing at a low temperature of up to 900° C., has high bending strength and is less subjected to chipping damage when cut, as well as providing a multilayer ceramic substrate using the dielectric ceramic.

The dielectric ceramic of the present invention is obtained by firing a raw material comprising an alumina powder, a crystallizable glass powder mainly containing $SiO_2$, CaO and MgO, and a noncrystallizable glass powder mainly containing $SiO_2$, $B_2O_3$ and $Na_2O$. After the firing, the dielectric ceramic contains an alumina crystal phase, adiopside crystal phase (Ca(Mg, Al) (Si, Al)$_2O_6$) and a magnesia-spinel crystal phase ($MgAl_2O_4$) and has a porosity of not higher than 2.2% when measured by a mercury penetration method. The mercury penetration method is a porosity measurement method which utilizes a high surface tension of silver. The porosity level can be measured from a pressure applied for silver penetration. The pore volume can be measured from the amount of silver that penetrated into pores.

Due to the inclusion of the diopside and magnesia-spinel crystal phases, the dielectric ceramic of the present invention exhibits a high bending strength. Due also to the porosity of not higher than 2.2%, its chipping width can be reduced to 50 μm or below. Such reduction of porosity and chipping damage is not conventionally known but has been found by the inventor of this application.

More preferably, the porosity is not higher than 2.0%.

As described above, the dielectric ceramic of the present invention is obtained by firing a raw material comprising an alumina powder, a crystallizable glass powder mainly containing $SiO_2$, CaO and MgO, and a noncrystallizable glass powder mainly containing $SiO_2$, $B_2O_3$ and $Na_2O$. Preferably, the raw material contains 25–70% (more preferably 40–70%) by weight of the alumina powder, 25–70% by weight of the crystallizable glass powder and 3–20% by weight of the noncrystallizable glass powder. The lower content of the crystallizable glass powder increases the porosity. If the content of the crystallizable glass powder is excessively high, the relative amount of the alumina powder decreases to result in the reduction of bending strength. If the content of the noncrystallizable glass powder is low, the effectiveness in reducing the porosity becomes small. Since the noncrystallizable glass powder is lower in strength, the excessive higher content thereof lowers bending strength.

In the present invention, the alumina powder and the glass powder, collective of the crystallizable glass powder and noncrystallizable glass powder, are blended such that the alumina powder:glass powder ratio is preferably within the range of 70:30-25:75.

The crystallizable glass powder preferably has a composition comprising 30–60% by weight of $SiO_2$, 15–35% by weight of CaO and 25–45% by weight of MgO. The noncrystallizable glass powder preferably has a composition comprising 40–80% by weight of $SiO_2$, 10–50% by weight of $B_2O_3$ and 5–10% by weight of $Na_2O$.

In the present invention, firing is preferably carried out at a temperature of about 800° C.-about 900° C. Firing at a maximum temperature is preferably maintained for about 0.5–10 hours, more preferably 1–5 hours. Also preferably, the maximum temperature during firing is set at a level above a crystallization initiating temperature of the glass powder.

The multilayer ceramic substrate of the present invention is characterized as having a structure in which a dielectric layer comprising the dielectric ceramic of this invention and a conductive layer are placed above each other. This multilayer ceramic substrate can be obtained by firing multilayers of ceramic green sheets each comprising a dielectric layer and a conductive layer formed on the dielectric layer.

In accordance with the present invention, a dielectric ceramic and a multilayer ceramic substrate are provided which can be obtained through firing at a low temperature of not exceeding 900° C., have high bending strength and are less subjected to chipping damage when cutting is applied.

DESCRIPTION OF THE PREFERRED EXAMPLES

The present invention is now described in detail with reference to examples. The following examples illustrate the practice of the present invention but are not intended to be limiting thereof.

(Preparation of Dielectric Ceramic)

EXAMPLE 1

450 g of a-alumina powder (mean particle diameter 3 μm), 500 g of a crystallizable glass powder (50 wt. % $SiO_2$, 20 wt. % CaO, 30 wt. % MgO, mean particle diameter 3 μm, softening point 750° C., crystallization initiating temperature 800° C.), 50 g of a noncrystallizable glass powder (65 wt. % $SiO_2$, 30 wt. % $B_2O_3$, 5 wt. % $Na_2O$, mean particle diameter 3 μm, softening point 870° C.), 450 g of isopropanol (IPA), 300 g of butyl acetate, 20 g of an olefin-maleic acid copolymer dispersant, 120 g of a polyvinyl acetate binder and 50 g of an acrylic binder were pulverized and mixed in a ball mill for 4 hours.

The resulting slurry was formed into a 50 cm thick sheet using a doctor blade equipment. 100 mm square parts were cut out from this sheet, arranged in layers and then press bonded to provide a sheet. Then, a test piece was cut out from the press bonded sheet.

Figure 9:
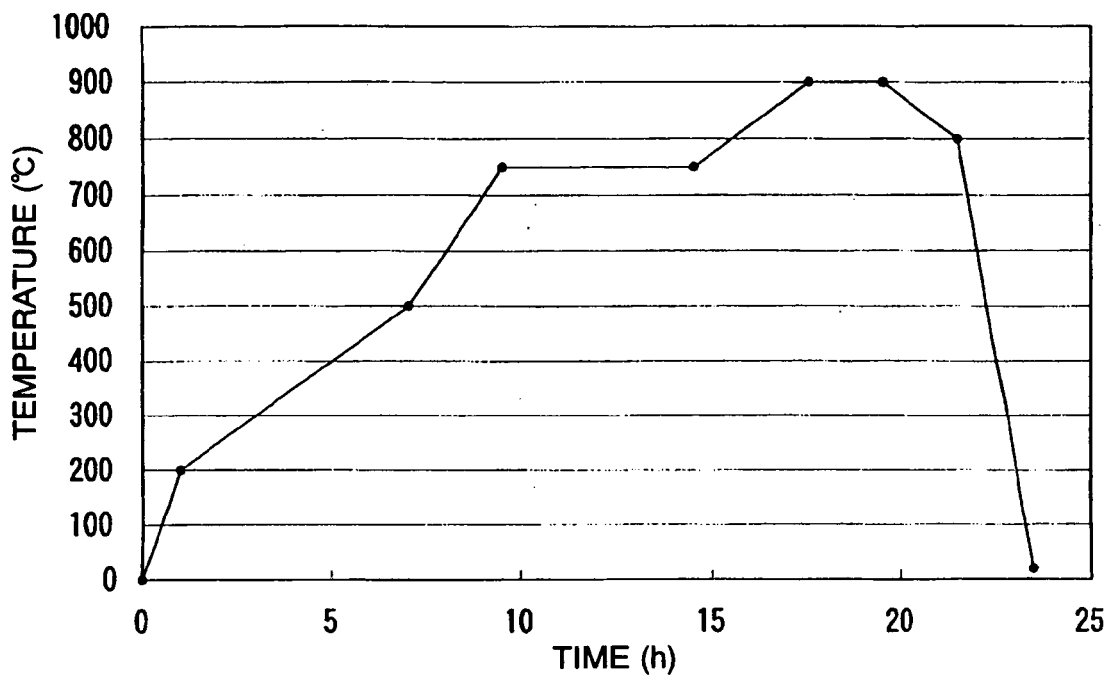
FIG. 9 is a graph showing a firing profile used in Example 1 in accordance with the present invention.

The obtained test piece was fired using the firing profile shown in FIG. 9 (maximum temperature 900° C.) to obtain a sample.

COMPARATIVE EXAMPLE 1

The procedure of Example 1 was followed, except that 550 g of the crystallizable glass powder alone was used instead of using 500 g of the crystallizable glass powder and 50 g of the noncrystallizable glass powder, to prepare a slurry. Using this slurry, sheets were formed, arranged in layers, press bonded and then fired to prepare a sample.

COMPARATIVE EXAMPLE 2

In Example 1, the amount of a-alumina powder was altered to 400 g. Also, 600 g of the crystallizable glass powder was used as the sole glass powder. Otherwise, the procedure of Example 1 was followed to prepare a slurry. Using this slurry, sheets were formed, arranged in layers, press bonded and then fired to prepare a sample.

(Measurement of X-Ray Diffraction Pattern)

Figure 3:
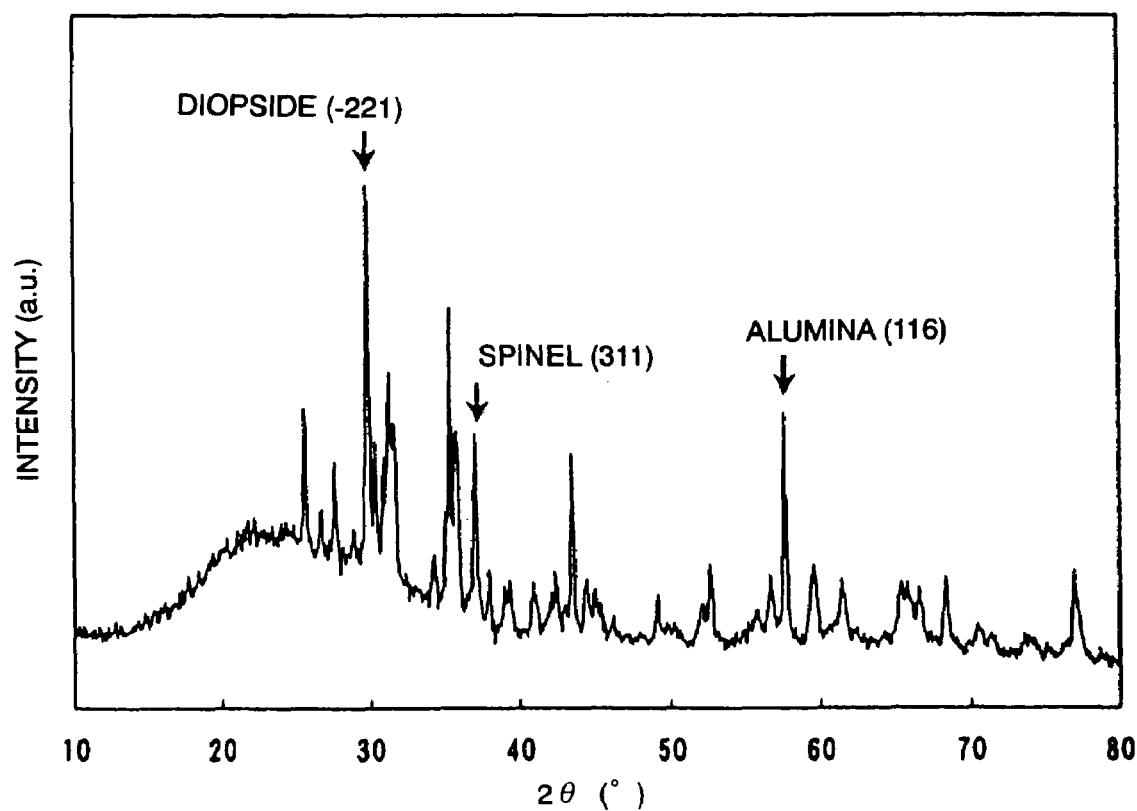
FIG. 3 is a chart showing an X-ray diffraction pattern of the dielectric ceramic of Example 1.
Figure 4:
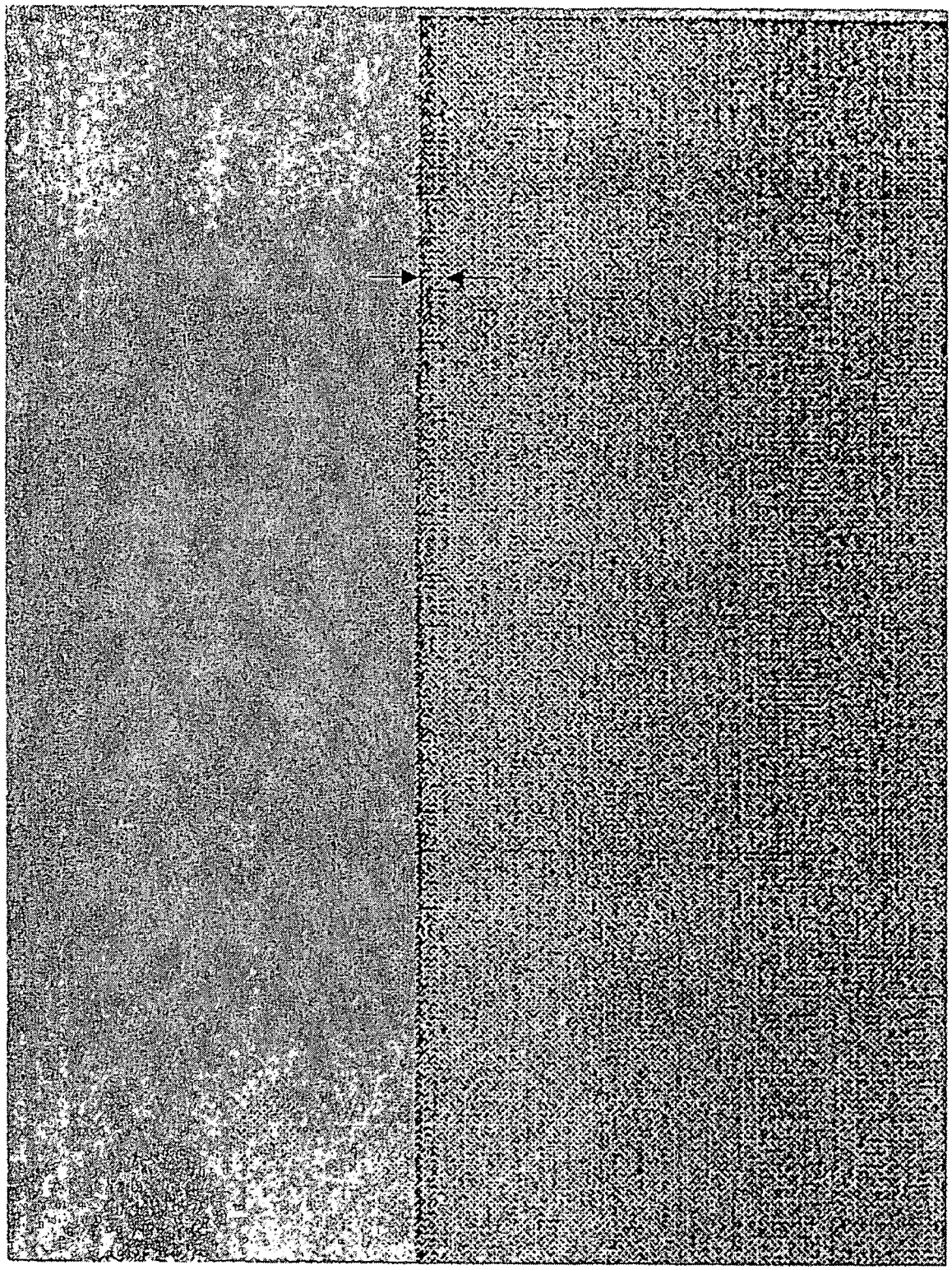
FIG. 4 is a micrograph showing an optical microscopic image of a chipping site left after the dielectric ceramic of Example 1 in accordance with the present invention was cut.
Figure 5:
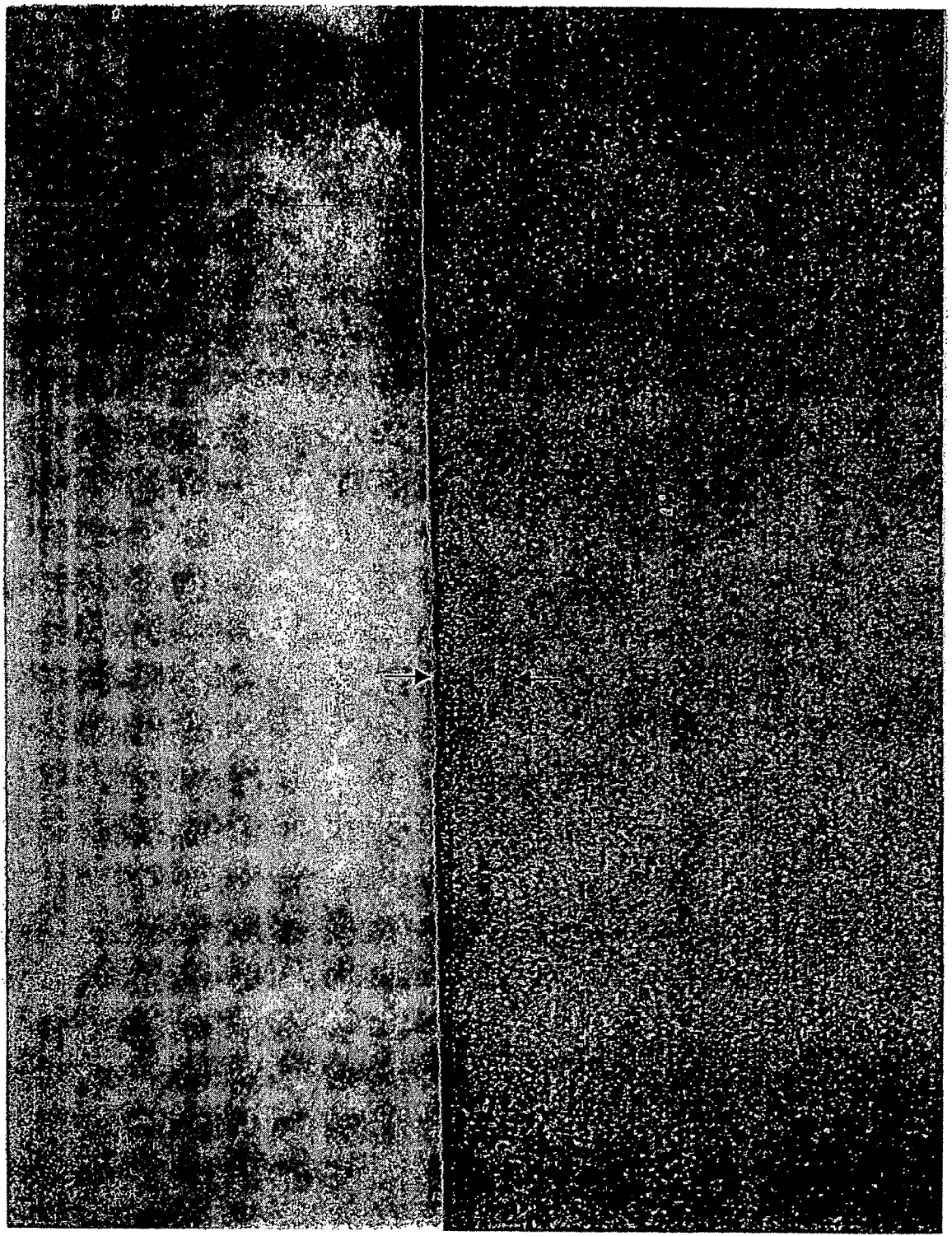
FIG. 5 is a micrograph showing an optical microscopic image of a chipping site left after the dielectric ceramic of Comparative Example 1 was cut.
Figure 6:
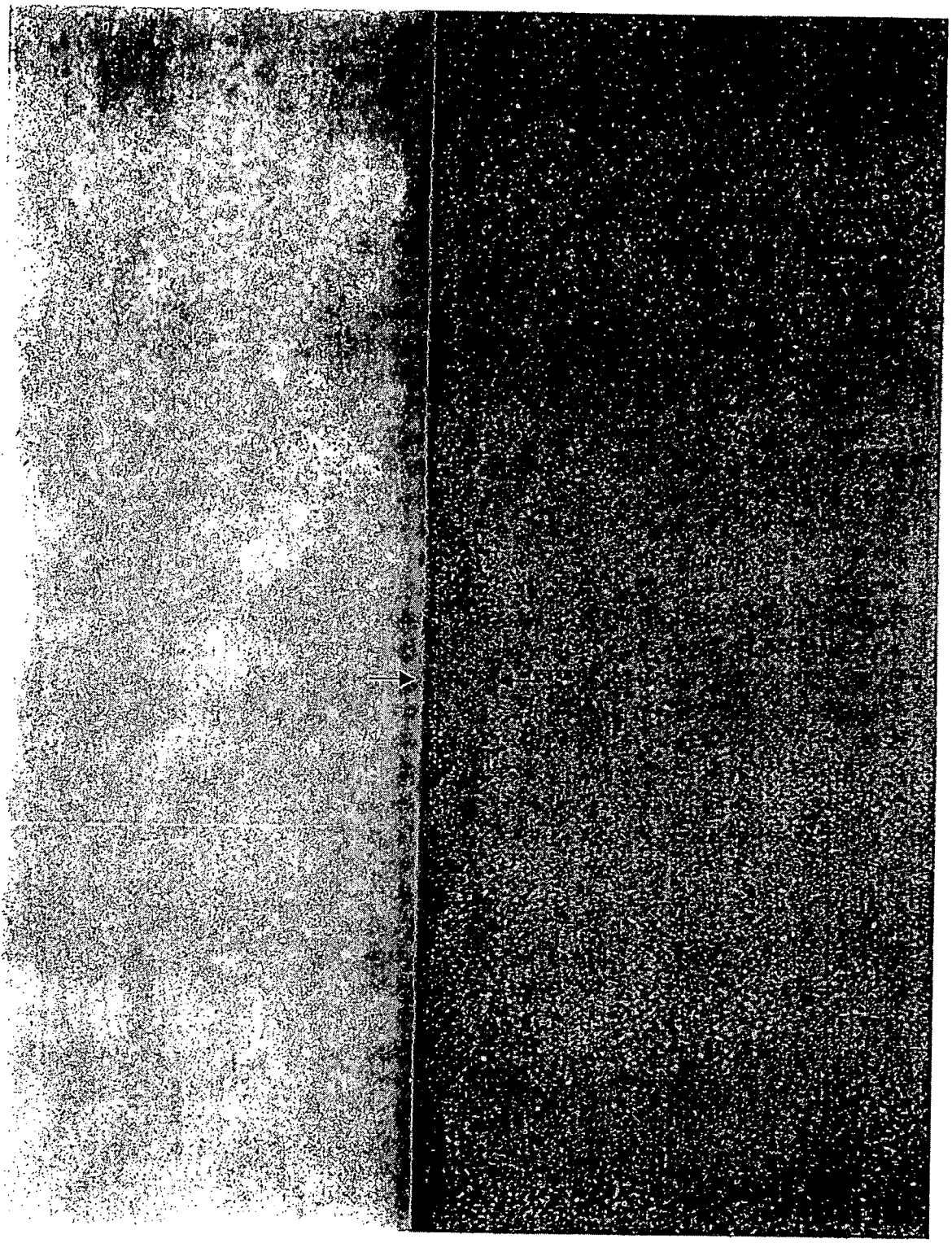
FIG. 6 is a micrograph showing an optical microscopic image of a chipping site left after the dielectric ceramic of Comparative Example 2 was cut.

The X-ray diffraction (XRD) pattern, measured for the sample obtained in Example 1, is shown in FIG. 3. As shown in FIG. 3, the respective peaks of the alumina crystal phase, diopside crystal phase and magnesia-spinel crystal phase appear in the chart.

(Measurement of Bending Strength)

The bending strength (three-point bending strength) for each sample (obtained in Example 1, Comparative Examples 1 and 2) was measured according to JIS R 1601 (Japanese Industrial Standards: Testing method for bending strength of fine ceramics). The measurement results are shown in Table 1.

(Section Observation and Measurement of Porosity)

Figure 1:
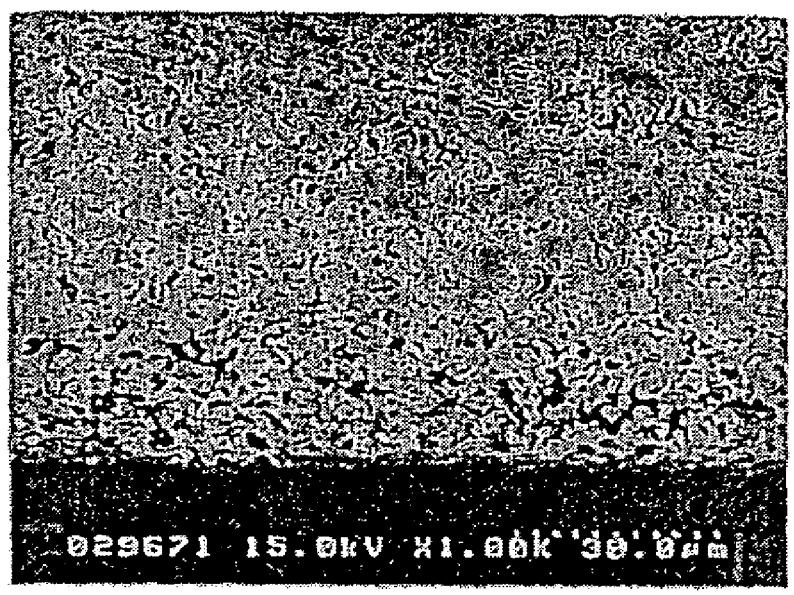
FIG. 1 is a micrograph showing a reflection electron image of a section of the dielectric ceramic of Example 1 in accordance with the present invention.
Figure 2:
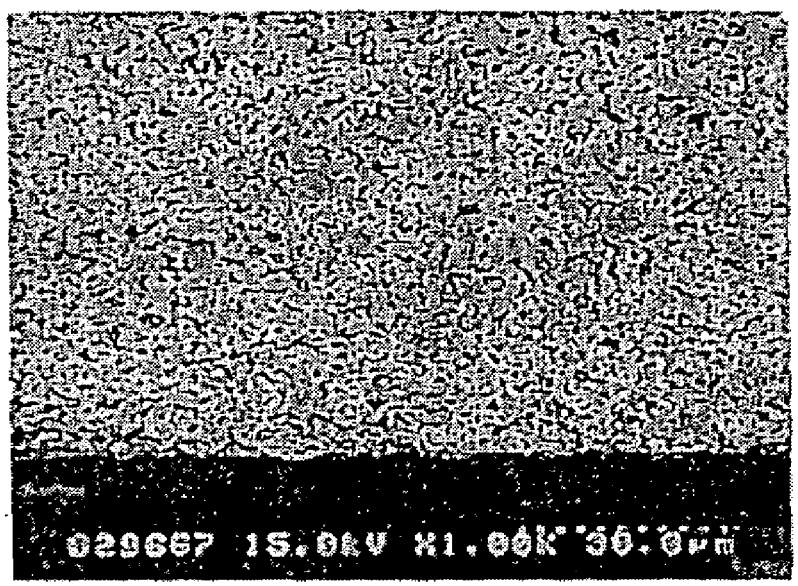
FIG. 2 is a micrograph showing a reflection electron image of a section of the dielectric ceramic of Comparative Example 1.

A reflection electron image of a section was observed for the samples obtained in Example 1 and Comparative Example 1. FIG. 1 shows a reflection electron image of a section of the sample of Example 1, and FIG. 2 shows a reflection electron image of a section of the sample of Comparative Example 1. In FIGS. 1 and 2, portions appearing dark are considered to be pores. From comparison between FIGS. 1 and 2, the Example 1 sample shown in FIG. 1 apparently has less pores than the Comparative Example 1 sample shown in FIG. 2.

Also, the mercury penetration method was utilized to measure a porosity for each of the samples of Example 1 and Comparative Examples 1 and 2. The measurement results are shown in Table 1.

(Measurement of Chipping Width)

For the samples of Example 1, Comparative Examples 1 and 2, cutting was applied to measure a width of chipping produced when each sample was cut. The measurement samples had a size of 20–25 mm×20–25 mm×0.15–0.2 mm. Each sample was cut at a cutting speed of 20 mm/sec using a blade (model No. SD400, 0.15 mm thick) manufactured by Disco Corp. An optical microscope was utilized to read a width (chipping width) of a site where chipping was produced.

The bending strength, porosity and chipping width of each sample are listed in Table 1.

TABLE 1

|  | Bending Strength (MPa) | Porosity (%) | Chipping Width (μm) |
| --- | --- | --- | --- |
| Ex. 1 | 300 | 2.00 | 30 |
| Comp. Ex. 1 | 250 | 3.66 | 150 |
| Comp. Ex. 2 | 270 | 2.50 | 140 |

Figure 10:
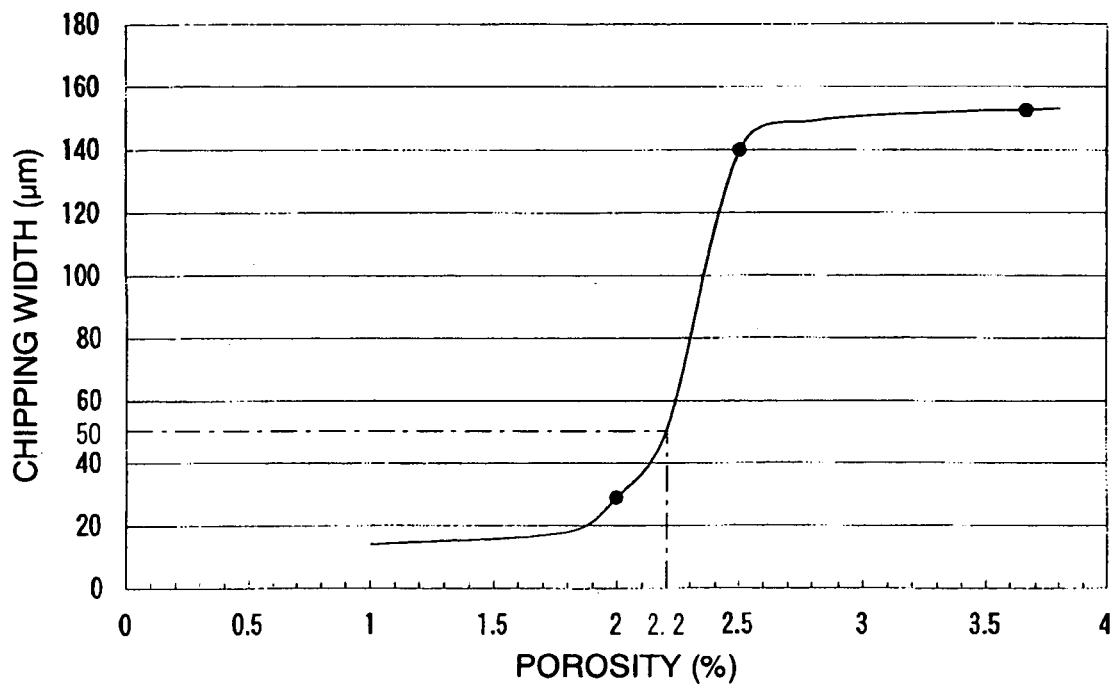
FIG. 10 is a graph showing a porosity of the dielectric ceramic as related to a width of the chipping.

FIG. 10 shows a relationship between the porosity and chipping width. As can be clearly seen from the results shown in FIG. 10, as the porosity falls to 2.2% or below, the chipping width shows a drastic drop, i.e., drops to 50 μm or below. This demonstrates that the chipping damage can be markedly reduced if the porosity is kept within 2.2%.

(Multilayer Ceramic Substrate)

Figure 7:
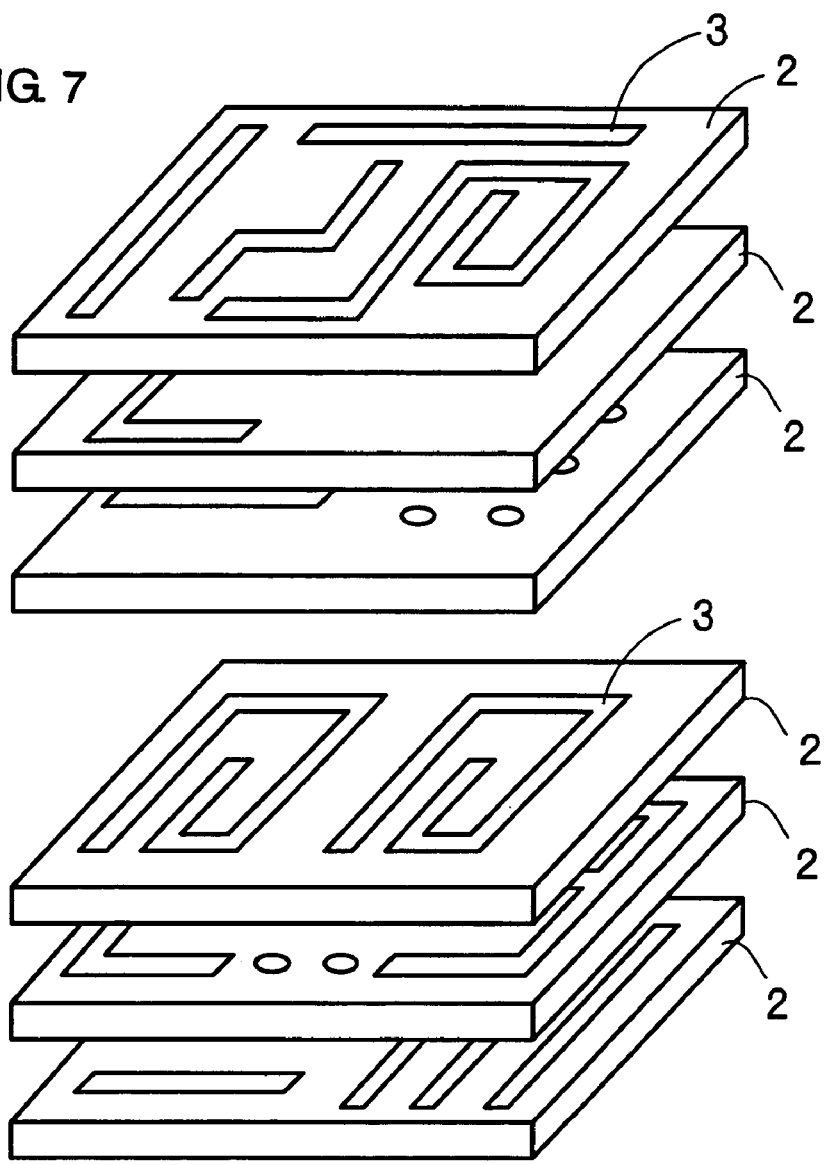
FIG. 7 is an exploded perspective view showing an embodiment of a multilayer ceramic substrate in accordance with the present invention.
Figure 8:
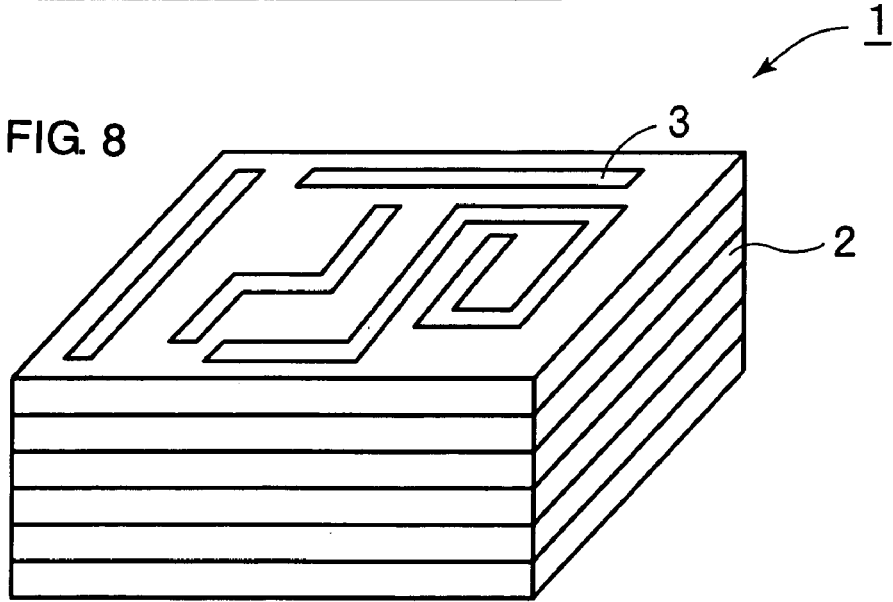
FIG. 8 is a perspective view showing an embodiment of a multilayer ceramic substrate in accordance with the present invention.

FIGS. 7 and 8 are an exploded perspective view and a perspective view, respectively, which show an embodiment of a multilayer ceramic substrate of the present invention. As shown in FIG. 7, a conductive layer 3, composed of silver, is formed on a dielectric layer 2. Stacking and subsequent firing of such dielectric layers 2 results in obtaining a multilayer ceramic substrate 1 as shown in FIG. 8. An inductor or capacitor, according to a circuit pattern of the conductive layer 3, is provided internally of the multilayer ceramic substrate 1.

The use of the dielectric ceramic of the present invention for the dielectric layer 2 enables fabrication of a multilayer ceramic substrate which can be obtained through low-temperature firing, has a high bending strength and is less subjected to chipping damage when it is cut.

What is claimed is:

1. A dielectric ceramic obtained by firing a raw material comprising an alumina powder, a crystallizable glass powder mainly containing $SiO_2$, CaO and MgO, and a noncrystallizable glass powder mainly containing $SiO_2$, $B_2O_3$ and $Na_2O$, wherein, after the firing, said dielectric ceramic contains an alumina crystal phase, a diopside crystal phase (Ca(Mg, Al)(Si, Al)$_2$O$_6$) and a magnesia-spinel crystal phase (MgAl$_2$O$_4$) and has a porosity of not higher than 2.2% when measured by a mercury penetration method.

2. The dielectric ceramic as recited in claim 1, wherein said raw material comprises 25–70% by weight of said alumina powder, 25–75% by weight of said crystallizable glass powder and 3–20% by weight of said noncrystallizable glass powder.

3. The dielectric ceramic as recited in claim 1, wherein a blending proportion (alumina powder:glass powder) of said alumina powder and the glass powder, collective of said crystallizable glass powder and noncrystallizable glass powder, is within the range of 70:30–25:75.

4. The dielectric ceramic as recited in claim 1, wherein said crystallizable glass powder has a composition comprising 30–60% by weight of $SiO_2$, 15–35% by weight of CaO and 25–45% by weight of MgO.

5. The dielectric ceramic as recited in claim 1, wherein said noncrystallizable glass powder has a composition comprising 40–80% by weight of $SiO_2$, 10–50% by weight of $B_2O_3$ and 5–10% by weight of $Na_2O$.

6. A multilayer ceramic substrate having a structure in which a dielectric layer comprising the dielectric ceramic as recited in claim 1 and a conductive layer are placed above each other.

* * * * *